United States Patent
Luo

(10) Patent No.: US 9,172,297 B2
(45) Date of Patent: Oct. 27, 2015

(54) FREQUENCY MULTIPLIER AND METHOD FOR GENERATING FREQUENCY MULTIPLIED SIGNALS

(71) Applicant: Huawei Technologies Co., Ltd., Shenzhen (CN)

(72) Inventor: Xun Luo, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 137 days.

(21) Appl. No.: 14/029,317

(22) Filed: Sep. 17, 2013

(65) Prior Publication Data

US 2014/0022830 A1    Jan. 23, 2014

Related U.S. Application Data

(63) Continuation of application No. PCT/CN2012/071267, filed on Feb. 17, 2012.

(51) Int. Cl.
*H03K 3/02* (2006.01)
*H02M 1/12* (2006.01)
*H03B 19/14* (2006.01)

(52) U.S. Cl.
CPC ............... *H02M 1/126* (2013.01); *H03B 19/14* (2013.01)

(58) Field of Classification Search
CPC . H03L 2207/10; H03L 2207/12; H03L 7/091; H03L 7/20; H03L 7/00; H03K 3/0231; H03B 28/00
USPC ............ 327/119, 141, 147, 156–163; 331/11, 331/25, 16, 45, 100, 114
See application file for complete search history.

(56) References Cited

U.S. PATENT DOCUMENTS 3,706,096 A * 12/1972 Hammack ...................... 342/107
5,084,685 A * 1/1992 Moller et al. .................. 331/1 A
(Continued)

FOREIGN PATENT DOCUMENTS

CN         1643801 A      7/2005
CN       101656344 A      2/2010
(Continued)

OTHER PUBLICATIONS

Lin et al., "Analysis of Multiconductor Coupled-Line Marchand Baluns for Miniature MMIC Design" IEEE Transactions on Microwave Theory and Techniques, vol. 55, No. 6, Jun. 2007, 10 pages.

*Primary Examiner* — Rajnikant Patel
(74) *Attorney, Agent, or Firm* — Brinks Gilson & Lione

(57) ABSTRACT

The present disclosure provides a method, includes: a first stepped-impedance transmission line configured to receive a first signal of a first differential signal; a second stepped-impedance transmission line configured to receive a second signal of the first differential signal, where the first stepped-impedance transmission line and the second stepped-impedance transmission line superpose the first signal of the first differential signal on the second signal of the first differential signal to obtain a first frequency multiplied signal; a first inverse stepped-impedance transmission line configured to be inversely ground-coupled with the first stepped-impedance transmission line and grounded at an end near an output end of the first stepped-impedance transmission line; a second inverse stepped-impedance transmission line configured to be inversely ground-coupled with the second stepped-impedance transmission line and grounded at an end near an output end of the second stepped-impedance transmission line.

14 Claims, 10 Drawing Sheets

(56) References Cited

U.S. PATENT DOCUMENTS

| | | | |
|---|---|---|---|
| 6,107,891 A * | 8/2000 | Coy | 331/18 |
| 6,147,567 A * | 11/2000 | Welland et al. | 331/179 |
| 6,275,118 B1 | 8/2001 | Saito et al. | |
| 6,686,804 B1 * | 2/2004 | Adams et al. | 331/17 |
| 6,933,791 B2 * | 8/2005 | Chen | 331/45 |
| 7,656,236 B2 * | 2/2010 | Williams | 331/16 |
| 8,502,610 B2 * | 8/2013 | Pellon et al. | 331/46 |
| 2002/0145475 A1 * | 10/2002 | Fenton et al. | 331/25 |
| 2011/0298955 A1 | 12/2011 | Horimoto et al. | |
| 2014/0232482 A1 * | 8/2014 | Wada et al. | 333/134 |

FOREIGN PATENT DOCUMENTS

| | | |
|---|---|---|
| CN | 101789767 A | 7/2010 |
| CN | 102104362 A | 6/2011 |
| CN | 102104363 A | 6/2011 |
| CN | 102355238 A | 2/2012 |
| EP | 0266198 A2 | 5/1988 |
| EP | 1486007 B1 | 12/2004 |
| WO | WO 2010/058247 A1 | 5/2010 |

* cited by examiner

FREQUENCY MULTIPLIER AND METHOD FOR GENERATING FREQUENCY MULTIPLIED SIGNALS

CROSS-REFERENCE TO RELATED APPLICATIONS

This application is a continuation of International Application No. PCT/CN2012/071267, filed on Feb. 17, 2012, which is hereby incorporated by reference in its entirety.

FIELD

Embodiments of the present disclosure relate to the field of electronic technologies, and in particular, to a frequency multiplier and a method for generating frequency multiplied signals.

BACKGROUND

Under requirements of high-speed and high-traffic wireless communication, working frequencies of a communication system are becoming higher and higher and working bandwidths are becoming larger and larger. A local frequency source having a high working frequency in a system is facing a great challenge. Therefore, a frequency multiplier (especially a frequency multiplier having a simple structure) is widely used to increase a working frequency band of a frequency source. However, a conventional frequency multiplier has a problem of being unable to suppress an even harmonic wave.

A solution using a frequency multiplier with discrete element design has been proposed. The frequency multiplier is a frequency synthesizer circuit with double-ended input and single-ended output. An electrical length of every branch transmission line is an integral multiple of one half wavelength corresponding to a reference working frequency. The electrical length of the transmission line is adjusted to output a resonance point corresponding to a load, so that the entire circuit works with a multiplied frequency of the reference working frequency, thereby implementing frequency synthesis.

However, the conventional frequency multiplier is capable of outputting only one frequency multiplied signal and cannot output differential signals.

SUMMARY OF THE DISCLOSURE

Embodiments of the present disclosure provide a frequency multiplier and a method for generating frequency multiplied signals to enable a frequency multiplier to output differential signals.

In one aspect, a frequency multiplier is provided, including: a first stepped-impedance transmission line configured to receive a first signal of a first differential signal at an input end; a second stepped-impedance transmission line configured to receive a second signal of the first differential signal at an input end, where the first stepped-impedance transmission line and the second stepped-impedance transmission line superpose the first signal of the first differential signal on the second signal of the first differential signal to obtain a first frequency multiplied signal at an output end, a frequency of the first frequency multiplied signal is 2*N times a frequency of the first differential signal, and N is an integer greater than or equal to 1; a first inverse stepped-impedance transmission line configured to be inversely ground-coupled with the first stepped-impedance transmission line and grounded at an end near the output end of the first stepped-impedance transmission line; and a second inverse stepped-impedance transmission line configured to be inversely ground-coupled with the second stepped-impedance transmission line and grounded at an end near the output end of the second stepped-impedance transmission line, where another end of the first inverse stepped-impedance transmission line and another end of the second inverse stepped-impedance transmission line superpose signals to output a second frequency multiplied signal, a frequency of the second frequency multiplied signal is 2*N times the frequency of the first differential signal, and the first frequency multiplied signal and the second frequency multiplied signal are second differential signals.

In one aspect, a frequency multiplier is provided, including: a first stepped-impedance transmission line configured to receive a first signal of a first differential signal at an input end; a second stepped-impedance transmission line configured to receive a second signal of the first differential signal at an input end, where the first stepped-impedance transmission line and the second stepped-impedance transmission line superpose the first signal of the first differential signal on the second signal of the first differential signal to obtain a first frequency multiplied signal at an output end, a frequency of the first frequency multiplied signal is 2*N times a frequency of the first differential signal, and N is an integer greater than or equal to 1; a first group of open stubs, where an end of the first group of open stubs is connected to the first stepped-impedance transmission line and another end is open for suppressing harmonic components of the first differential signal; and a second group of open stubs, where an end of the second group of open stubs is connected to the second stepped-impedance transmission line and another end is open for suppressing harmonic components of the first differential signal.

In one aspect, a method for generating frequency multiplied signals is provided, including: superposing a first signal of a first differential signal transmitted by a first stepped-impedance transmission line on a second signal of the first differential signal transmitted by a second stepped-impedance transmission line to output a first frequency multiplied signal, where a frequency of the first frequency multiplied signal is 2*N times a frequency of the first differential signal, and N is an integer greater than or equal to 1; obtaining a second frequency multiplied signal by using a first inverse stepped-impedance transmission line and a second inverse stepped-impedance transmission line respectively inversely ground-coupled with the first stepped-impedance transmission line and the second stepped-impedance transmission line, where the first frequency multiplied signal and the second frequency multiplied signal are second differential signals, a frequency of the second frequency multiplied signal is 2*N times the frequency of the first differential signal, and a phase difference between the second frequency multiplied signals is equal to 90 degrees or not equal to 90 degrees.

According to the solutions, differential signals may be superposed by using two inverse stepped-impedance transmission lines respectively inversely ground-coupled with two stepped-impedance transmission lines, so that frequency multiplied differential signals are output.

DETAILED DESCRIPTION OF THE EMBODIMENTS

The following clearly and completely describes the solutions according to the embodiments of the present disclosure with reference to the accompanying drawings in the embodiments of the present disclosure. Apparently, the embodiments in the following description are merely a part rather than all of the embodiments of the present disclosure. All other embodiments obtained by persons of ordinary skill in the art based on the embodiments of the present disclosure without creative efforts shall fall within the protection scope of the present disclosure.

A common frequency multiplier for outputting a single signal cannot output in-phase/quadrature (In-phase/Quadrature, I/Q) signals, and an output end of the frequency multiplier includes harmonic components, resulting in low spectral purity. In addition, a solution in which a filter is used to eliminate harmonic components requires additional power to amplify a frequency multiplied signal to meet system requirements, which results in power backoff of an output frequency of a frequency source, increases total system power consumption, and increases system design difficulty.

Figure 1:
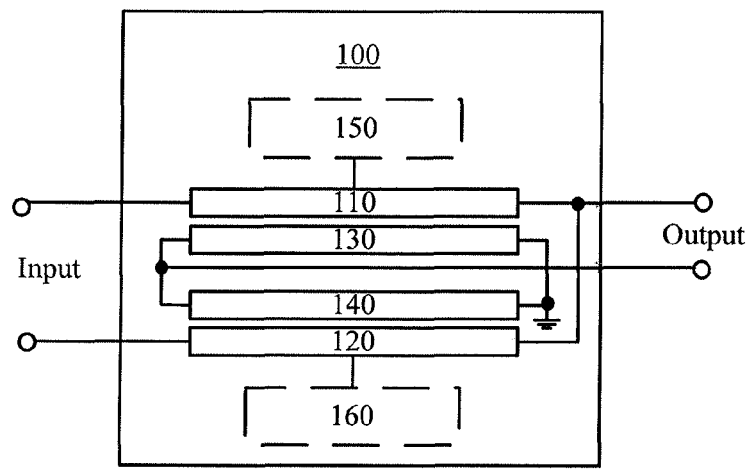
FIG. 1 is a block diagram of a frequency multiplier according to an embodiment of the present disclosure.

FIG. 1 is a block diagram of a frequency multiplier 100 according to an embodiment of the present disclosure. The frequency multiplier 100 shown in FIG. 1 includes: a first stepped-impedance transmission line (Stepped-Impedance Transmission Line) 110, a second stepped-impedance transmission line 120, a first inverse stepped-impedance transmission line (Inverse Stepped-Impedance Transmission Line) 130, and a second inverse stepped-impedance transmission line 140.

The first stepped-impedance transmission line 110 receives a first signal of a first differential signal at an input end. The second stepped-impedance transmission line 120 receives a second signal of the first differential signal at an input end. The first stepped-impedance transmission line 110 and the second stepped-impedance transmission line 120 superpose the first signal of the first differential signal on the second signal of the first differential signal to obtain a first frequency multiplied signal at an output end, where a frequency of the first frequency multiplied signal is 2*N times a frequency of the first differential signal, and N is an integer greater than or equal to 1. The first inverse stepped-impedance transmission line 130 is configured to be inversely ground-coupled with the first stepped-impedance transmission line 110 and is grounded at an end near an output end of the first stepped-impedance transmission line 110. The second inverse stepped-impedance transmission line 140 is configured to be inversely ground-coupled with the second stepped-impedance transmission line 120 and is grounded at an end near an output end of the second stepped-impedance transmission line 120. Another end of the first inverse stepped-impedance transmission line 130 and another end of the second inverse stepped-impedance transmission line 140 superpose signals to output a second frequency multiplied signal, where a frequency of the second frequency multiplied signal is 2*N times the frequency of the first differential signal, and the first frequency multiplied signal and the second frequency multiplied signal are second differential signals.

For example, the stepped-impedance transmission lines may be transmission lines having stepped characteristic impedance along a length direction. The embodiment of the present disclosure is not limited thereto and the stepped-impedance transmission lines may also be a circuit including an electrical resistor, an inductor and/or a capacitor. Superposing the first signal of the first differential signal on the second signal of the first differential signal refers to synthesizing the first signal and the second signal to a frequency multiplied signal.

For example, coupling may be electromagnetic coupling. The first stepped-impedance transmission line and the first inverse stepped-impedance transmission line are placed in parallel, and the second stepped-impedance transmission line and the second inverse stepped-impedance transmission line are placed in parallel, so that when a signal is transmitted in the first stepped-impedance transmission line and the second stepped-impedance transmission line, a corresponding resonance signal is generated in the first inverse stepped-impedance transmission line and the second inverse stepped-impedance transmission line. Here, the inversely ground-coupling means that an end of the inverse stepped-impedance transmission line corresponding to an output end of the stepped-impedance transmission line is grounded, while another end of the inverse stepped-impedance transmission line is an output end of signals, so that inverse signals may be generated in the inverse stepped-impedance transmission line.

The frequency multiplier according to the embodiment of the present disclosure is capable of superposing input differential signals by respectively inversely ground-coupling two stepped-impedance transmission lines with two inverse stepped-impedance transmission lines to output frequency multiplied differential signals.

Optionally, as another embodiment, the frequency multiplier 100 further includes a first group of open stubs (Open-Stub) 150 and a second group of open stubs 160.

An end of the first group of open stubs 150 is connected to the first stepped-impedance transmission line and another end is open for suppressing harmonic components of the first differential signal. An end of the second group of open stubs 160 is connected to the second stepped-impedance transmission line and another end is open for suppressing harmonic components of the first differential signal.

For example, the frequency of the first differential signal is a reference working frequency $f_0$ of the frequency multiplier 100, and the open stubs are configured to suppress even harmonic components whose frequencies are $4f_0$, $6f_0$, $8f_0$, and so on in the first differential signal, thereby outputting a frequency multiplied signal having a working frequency $2f_0$.

Here, "open" means that one end of the open stubs is not connected to other circuits and not grounded.

According to the embodiment of the present disclosure, harmonic components in a differential signal input to two transmission lines of the frequency multiplier 100 may be suppressed by using two groups of open stubs, so that a pure frequency multiplied signal is obtained. In addition, because no filter is required, power backoff can be reduced. Therefore, no additional power is required to amplify the frequency multiplied signal, and system design may be simplified.

According to an embodiment of the present disclosure, the first stepped-impedance transmission line 110 includes a first transmission line and a second transmission line having different characteristic impedance, where a first end of the first transmission line is connected to a first end of the second transmission line; the second stepped-impedance transmission line 120 includes a third transmission line and a fourth transmission line having different characteristic impedance, where a first end of the third transmission line is connected to a first end of the fourth transmission line, a second end of the first transmission line is connected to a first input end of the frequency multiplier 100, a second end of the third transmission line is connected to a second input end of the frequency multiplier 100, a second end of the second transmission line is connected to a second end of the fourth transmission line and to a first output end of the frequency multiplier 100.

According to an embodiment of the present disclosure, characteristic impedance and an electrical length of the first transmission line are respectively the same as characteristic impedance and an electrical length of the third transmission line, and characteristic impedance and an electrical length of the second transmission line are respectively the same as characteristic impedance and an electrical length of the fourth transmission line.

According to an embodiment of the present disclosure, an end of every open stub in the first group of open stubs 150 is connected to the first end of the first transmission line, and an end of every open stub in the second group of open stubs 160 is connected to the first end of the third transmission line.

According to an embodiment of the present disclosure, an end of the first group of open stubs 150 is connected to the second end of the first transmission line, and an end of the second group of open stubs 160 is connected to the second end of the third transmission line.

According to an embodiment of the present disclosure, the first transmission line, the second transmission line, the third transmission line, and the fourth transmission line are $\lambda/8$ transmission lines, either one of the first group of open stubs 150 and the second group of open stubs 160 includes open stubs having an electrical length of $\lambda/(4n)$, where $\lambda$ is a wavelength corresponding to the frequency of the first differential signal, and n is an even number greater than or equal to 4.

According to an embodiment of the present disclosure, at least one open stub having a specific electrical length may be used to suppress each even harmonic component in the above even harmonic components. For example, an open stub having an electrical length of $\lambda/(4n)$ is used to suppress an even harmonic component having a frequency of $nf_0$, where $\lambda$ is a wavelength corresponding to a reference working frequency $f_0$ of the frequency multiplier 100, and n may be an even number greater than or equal to 4.

According to an embodiment of the present disclosure, the first inverse stepped-impedance transmission line 130 includes a first inverse line and a second inverse line having different characteristic impedance, the first inverse line is inversely coupled with the first transmission line, the second inverse line is inversely coupled with the second transmission line, and a first end of the first inverse line is connected to a first end of the second inverse line; the second inverse stepped-impedance transmission line 140 includes a third inverse line and a fourth inverse line having different characteristic impedance, the third inverse line is inversely coupled with the third transmission line, the fourth inverse line is inversely coupled with the fourth transmission line, and a first end of the third inverse line is connected to a first end of the fourth inverse line, where a second end of the first inverse line and a second end of the third inverse line are parallel-connected and output to a second output end of the frequency multiplier 100, and a second end of the second inverse line and a second end of the fourth inverse line are parallel-connected and grounded.

According to an embodiment of the present disclosure, electrical lengths of the first inverse stepped-impedance transmission line 130 and the second inverse stepped-impedance transmission line 140 are respectively the same as or different from those of the first stepped-impedance transmission line 110 and the second stepped-impedance transmission line 120, so that a phase difference between the first frequency multiplied signal and the second frequency multiplied signal is equal to 90 degrees or not equal to 90 degrees.

For example, when electrical lengths of the first inverse stepped-impedance transmission line 130 and the first stepped-impedance transmission line 110 are the same, and electrical lengths of the second inverse stepped-impedance transmission line 140 and the second stepped-impedance transmission line 120 are the same, the first frequency multiplied signal is orthogonal to the second frequency multiplied signal, that is, the phase difference is 90 degrees; otherwise, the phase difference between the first frequency multiplied signal and the second frequency multiplied signal is not equal to 90 degrees. Therefore, according to the embodiment of the present disclosure, differential signals having a specific phase difference may be obtained by adjusting electrical lengths of the first inverse stepped-impedance transmission line 130 and the second inverse stepped-impedance transmission line 140.

According to an embodiment of the present disclosure, electrical lengths of the first transmission line, the second transmission line, the third transmission line, and the fourth transmission line are respectively the same as or different from those of the first inverse line, the second inverse line, the third inverse line, and the fourth inverse line.

For example, in cases where electrical lengths of the first transmission line, the second transmission line, the third transmission line, and the fourth transmission line are respectively the same as those of the first inverse line, the second inverse line, the third inverse line, and the fourth inverse line, orthogonal differential signals may be generated at the output end of the frequency multiplier 100. According to an embodiment of the present disclosure, electrical lengths of the first transmission line, the second transmission line, the third transmission line, and the fourth transmission line, and electrical lengths of the first inverse line, the second inverse line, the third inverse line, and the fourth inverse line may be adjusted as required to generate differential signals having different phase differences.

According to an embodiment of the present disclosure, the frequency multiplier 100 shown in FIG. 1 further includes a parallel strip base cover, where the first stepped-impedance transmission line 110, the second stepped-impedance transmission line 120, the first group of open stubs 150, the second group of open stubs 160, the first inverse stepped-impedance transmission line 130, and the second inverse stepped-impedance transmission line 140 are placed on the parallel strip base cover.

For example, the parallel strip base cover may be used to adjust an effective dielectric constant $\in_{e\!f\!f}$ of a base. For example, the effective dielectric constant $\in_{e\!f\!f}$ of the base may be increased to decrease the overall size of the frequency multiplier 100.

According to an embodiment of the present disclosure, the frequency multiplier 100 is cascaded with a second frequency multiplier, and a second differential signal of the frequency multiplier 100 is a differential signal to be input to the second frequency multiplier.

For example, multiple frequency multipliers may be cascaded, that is, an output end of a frequency multiplier is connected to an input end of a next frequency multiplier, thereby outputting differential signals having higher frequencies. The frequency multiplier 100 according to embodiments of the present disclosure is capable of outputting differential signals; therefore, an output signal of a frequency multiplier may be used as an input signal of a next frequency multiplier, so that cascading of frequency multipliers can be conveniently implemented.

Figure 2:
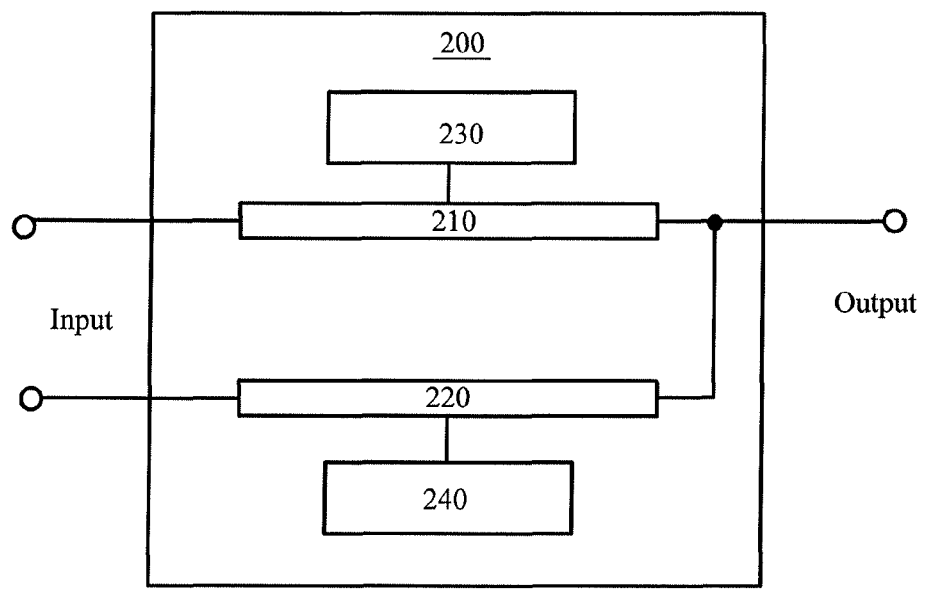
FIG. 2 is a block diagram of a frequency multiplier according to another embodiment of the present disclosure.

FIG. 2 is a block diagram of a frequency multiplier 200 according to another embodiment of the present disclosure. The frequency multiplier 200 shown in FIG. 2 includes a first stepped-impedance transmission line 210, a second stepped-impedance transmission line 220, a first group of open stubs 230, and a fourth group of open stubs 240. The first stepped-impedance transmission line 210 and the second stepped-impedance transmission line 220 in FIG. 2 are similar to the first stepped-impedance transmission line 110 and the second stepped-impedance transmission line 120 in FIG. 1, and the first group of open stubs 230 and the second group of open stubs 240 in FIG. 2 are similar to the first group of open stubs 150 and the second group of open stubs 160 in FIG. 1, and will not be described repeatedly herein.

The first stepped-impedance transmission line 210 receives a first signal of a first differential signal at an input end. The second stepped-impedance transmission line 220 receives a second signal of the first differential signal at an input end. The first stepped-impedance transmission line 210 and the second stepped-impedance transmission line 220 superpose the first signal of the first differential signal on the second signal of the first differential signal to obtain a first frequency multiplied signal at an output end, where a frequency of the first frequency multiplied signal is 2*N times a frequency of the first differential signal, and N is an integer greater than or equal to 1. For the first group of open stubs 230, an end of the first group of open stubs 230 is connected to the first stepped-impedance transmission line 210 and another end is open for suppressing harmonic components of the first differential signal. For the second group of open stubs 240, an end of the second group of open stubs 240 is connected to the second stepped-impedance transmission line 220 and another end is open for suppressing harmonic components of the first differential signal.

According to the solution, harmonic components in a differential signal input to two transmission lines of the frequency multiplier 200 may be suppressed by using two groups of open stubs, so that a pure frequency multiplied signal is obtained. In addition, because no filter is required, power backoff can be reduced. Therefore, no additional power is required to amplify the frequency multiplied signal, and system design may be simplified.

According to an embodiment of the present disclosure, the first stepped-impedance transmission line 210 includes a first transmission line and a second transmission line having different characteristic impedance, where a first end of the first transmission line is connected to a first end of the second transmission line; the second stepped-impedance transmission line 220 includes a third transmission line and a fourth transmission line having different characteristic impedance, where a first end of the third transmission line is connected to a first end of the fourth transmission line, a second end of the first transmission line is connected to a first input end of the frequency multiplier 200, a second end of the third transmission line is connected to a second input end of the frequency multiplier 200, a second end of the second transmission line is connected to a second end of the fourth transmission line and to a first output end of the frequency multiplier 200.

According to an embodiment of the present disclosure, characteristic impedance and an electrical length of the first transmission line are respectively the same as characteristic impedance and an electrical length of the third transmission line, and characteristic impedance and an electrical length of the second transmission line are respectively the same as characteristic impedance and an electrical length of the fourth transmission line.

According to an embodiment of the present disclosure, an end of every open stub in the first group of open stubs 230 is connected to the first end of the first transmission line, and an end of every open stub in the second group of open stubs 240 is connected to the first end of the third transmission line.

According to an embodiment of the present disclosure, an end of the first group of open stubs 230 is connected to the second end of the first transmission line, and an end of the second group of open stubs 240 is connected to the second end of the third transmission line.

According to an embodiment of the present disclosure, the first transmission line, the second transmission line, the third transmission line, and the fourth transmission line are $\lambda/8$ transmission lines, either one of the first group of open stubs 230 and the second group of open stubs 240 includes open stubs having an electrical length of $\lambda/(4n)$, where $\lambda$ is a wavelength corresponding to the frequency of the first differential signal, and n is an even number greater than or equal to 4.

According to an embodiment of the present disclosure, the frequency multiplier 200 shown in FIG. 2 further includes a parallel strip base cover, where the first stepped-impedance transmission line 210, the second stepped-impedance transmission line 220, the first group of open stubs 230, and the second group of open stubs 240 are placed on the parallel strip base cover.

According to an embodiment of the present disclosure, the frequency multiplier 200 is cascaded with a second frequency multiplier, and a second differential signal of the frequency multiplier 200 is a differential signal to be input to the second frequency multiplier.

Figure 3:
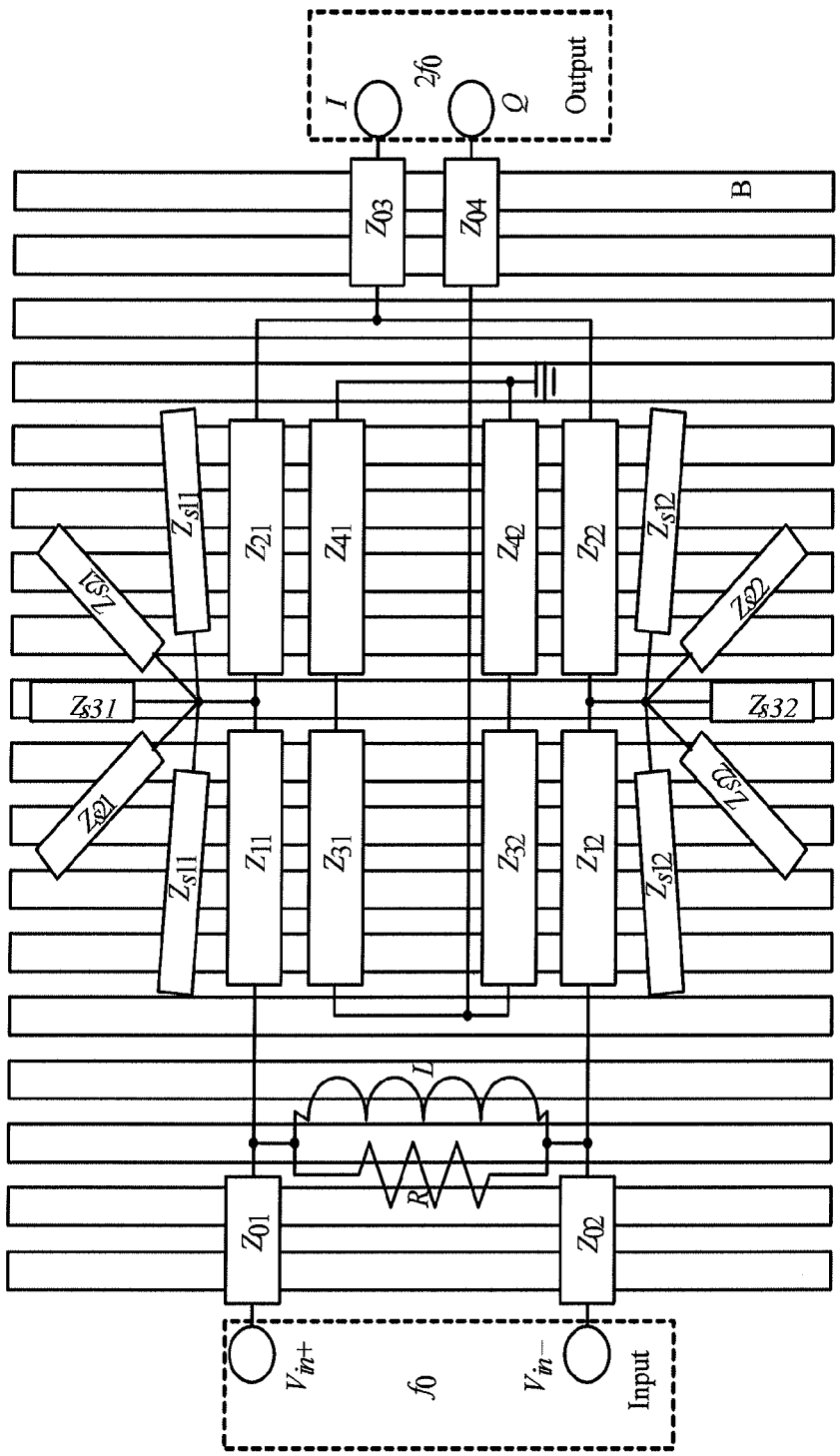
FIG. 3 is a circuit diagram of a frequency multiplier according to an embodiment of the present disclosure.

FIG. 3 is a circuit diagram of a frequency multiplier according to an embodiment of the present disclosure.

A frequency multiplier according to an embodiment of the present disclosure includes a structure of two stepped-impedance transmission lines, one parallel-connected electrical resistor and inductor, two groups of multiple open stubs, two inverse stepped-impedance transmission lines, and a parallel strip base cover. The two stepped-impedance transmission lines are respectively used to receive and transmit a first signal and a second signal of a first differential signal, and synthesize the first signal and the second signal into a first frequency multiplied signal, where a frequency of the first frequency multiplied signal is 2*N times a frequency of the first differential signal. The two groups of open stubs are respectively connected to the two transmission lines and are used to suppress harmonic components of the first differential signal. The two inverse stepped-impedance transmission lines are respectively inversely ground-coupled with the two transmission lines and are used to generate a second frequency multiplied signal, where a frequency of the second frequency multiplied signal is 2*N times the frequency of the first differential signal, and the first frequency multiplied signal and the second frequency multiplied signal are second differential signals.

For example, the two stepped-impedance transmission lines may be two microstrip stepped-impedance transmission lines: a first stepped-impedance transmission line and a second stepped-impedance transmission line. The first stepped-impedance transmission line includes a transmission line $Z_{11}$ and a transmission line $Z_{21}$ having different characteristic impedance. For example, the transmission line $Z_{11}$ has characteristic impedance $Z_1$, and the transmission line $Z_{21}$ has characteristic impedance $Z_2$. A first end of the transmission line $Z_{11}$ is connected to a first end of the transmission line $Z_{21}$. The second stepped-impedance transmission line includes a transmission line $Z_{12}$ and a transmission line $Z_{22}$ having different characteristic impedance. For example, the transmission line $Z_{12}$ has characteristic impedance $Z_1$, and the transmission line $Z_{22}$ has characteristic impedance $Z_2$. A first end of the transmission line $Z_{12}$ is connected to a first end of the transmission line $Z_{22}$, a second end of the transmission line $Z_{11}$ is connected to an input end $V_{in+}$ of the frequency multiplier, a second end of the transmission line $Z_{12}$ is connected to a second input end $V_{in-}$ of the frequency multiplier, a second end of the transmission line $Z_{21}$ is connected to a second end of the transmission line $Z_{22}$ and is connected to a first output end (for example, an output end $Z_{O3}$ having characteristic impedance $Z_0$) of the frequency multiplier. Characteristic impedance and an electrical length of the transmission line $Z_{11}$ are respectively the same as characteristic impedance and an electrical length of the transmission line $Z_{12}$, which are, for example, $Z_1$ and $\theta_1$ respectively. Characteristic impedance and an electrical length of the transmission line $Z_{21}$ are respectively the same as characteristic impedance and an electrical length of the transmission line $Z_{22}$, which are, for example, $Z_2$ and $\theta_2$ respectively. In particular, the transmission line $Z_{11}$, the transmission line $Z_{21}$, the transmission line $Z_{12}$, and the transmission line $Z_{22}$ are transmission lines having an electrical length of $\lambda/8$, where $\lambda$ is a wavelength corresponding to a reference working frequency $f_0$ of the frequency multiplier. A structure of either stepped-impedance transmission line respectively includes two transmission lines having different characteristic impedance, which means that every transmission line structure has stepped characteristic impedance. Dual-input ports $Z_{O1}$ and $Z_{O2}$ having characteristic impedance $Z_0$ are respectively connected to the transmission lines $Z_{11}$ and $Z_{12}$ having characteristic impedance $Z_1$, and an output port $Z_{O3}$ having characteristic impedance $Z_0$ is connected to the transmission lines $Z_{21}$ and $Z_{22}$ having characteristic impedance $Z_2$ in the structure of two stepped-impedance transmission lines.

According to an embodiment of the present disclosure, the two groups of open stubs include a first group of open stubs and a second group of open stubs, where the first group of open stubs includes $Z_{s11}$, $Z_{s21}$, and $Z_{s31}$, and the second group of open stubs includes $Z_{s12}$, $Z_{s22}$, and $Z_{s32}$. An end of every open stub in the first group of open stubs is connected to a first end of the transmission line $Z_{11}$ and another end is open; an end of every open stub in the second group of open stubs is connected to a first end of the transmission line $Z_{12}$ and another end is open. The embodiment of the present disclosure is not limited thereto. For example, an end of every open stub in the first group of open stubs is connected to a second end of the transmission line $Z_{11}$ and another end is open; an end of every open stub in the second group of open stubs is connected to a second end of the transmission line $Z_{12}$ and another end is open. For example, either one of the above two groups of open stubs includes open stubs having an electrical length of $\lambda/(4n)$, where $\lambda$ is a wavelength corresponding to a reference working frequency $f_0$ of the frequency multiplier, and n may be an even number greater than or equal to 4. For example, the two groups of multiple open stubs $Z_{sik}$ (i=1, 2, 3, ... and k=1, 2) include open stubs having characteristic impedance $Z_{si}$ (i=1, 2, 3, ...) and an electrical length $\lambda/(4n)$, and are respectively connected between two $\lambda/8$ transmission lines of either stepped-impedance transmission line in the structure of two stepped-impedance transmission lines. For example, the open stub $Z_{s11}$ is an open stub having characteristic impedance $Z_{s1}$ and an electrical length $\lambda/16$, and is used to eliminate a harmonic component having a frequency of $4f_0$. The open stub $Z_{s21}$ is an open stub having characteristic impedance $Z_{s2}$ and an electrical length $\lambda/24$, and is used to eliminate a harmonic component having a frequency of $6f_0$. The open stub $Z_{s31}$ is an open stub having characteristic impedance $Z_{s3}$ and an electrical length $\lambda/32$, and is used to eliminate a harmonic component having a frequency of $8f_0$, and so on. For example, the open stub $Z_{s12}$ is an open stub having characteristic impedance $Z_{s1}$ and an electrical length $\lambda/16$, and is used to eliminate a harmonic component having a frequency of $4f_0$. The open stub $Z_{s22}$ is an open stub having characteristic impedance $Z_{s2}$ and an electrical length $\lambda/24$, and is used to eliminate a harmonic component having a frequency of $6f_0$. The open stub $Z_{s33}$ is an open stub having characteristic impedance $Z_{s3}$ and an electrical length $\lambda/32$, and is used to eliminate a harmonic component having a frequency of $8f_0$, and so on. The embodiment of the present disclosure is not limited thereto, and more open stubs may be added to eliminate harmonic components of higher frequencies.

The first inverse stepped-impedance transmission line in the two inverse stepped-impedance transmission lines includes an inverse line $Z_{31}$ and an inverse line $Z_{41}$ having different characteristic impedance, the inverse line $Z_{31}$ is inversely coupled with the transmission line $Z_{11}$, the inverse line $Z_{41}$ is inversely coupled with the transmission line $Z_{21}$, and a first end of the inverse line $Z_{31}$ is connected to a first end of the inverse line $Z_{41}$; the second inverse stepped-impedance transmission line in the two inverse stepped-impedance transmission lines includes an inverse line $Z_{32}$ and an inverse line $Z_{42}$ having different characteristic impedance, the inverse line $Z_{32}$ is inversely coupled with the transmission line $Z_{12}$, the inverse line $Z_{42}$ is inversely coupled with the transmission line $Z_{22}$, a first end of the inverse line $Z_{32}$ is connected to a first end of the inverse line $Z_{42}$, a second end of the inverse line $Z_{31}$ and a second end of the inverse line $Z_{32}$ are parallel-connected and output to a second output end of the frequency multiplier, for example, an output end $Z_{O4}$ having characteristic impedance $Z_0$, and a second end of the inverse line $Z_{41}$ and a second end of the inverse line $Z_{42}$ are parallel-connected and grounded. In other words, the two inverse stepped-impedance transmission lines are respectively inversely ground-coupled with the structure of two transmission lines.

According to an embodiment of the present disclosure, a first frequency multiplied signal output by a first output end $Z_{O3}$ of the frequency multiplier and a second frequency multiplied signal output by a second output end $Z_{O4}$ of the frequency multiplier are second differential signals, and a phase difference between the first frequency multiplied signal and the second frequency multiplied signal depends on an electrical length $\theta_3$ of the first inverse stepped-impedance transmission line and an electrical length $\theta_4$ of the second inverse stepped-impedance transmission line. In other words, a phase difference between the first frequency multiplied signal and the second frequency multiplied signal is generated by adjusting $\theta_3$ and $\theta_4$. According to an embodiment of the present disclosure, electrical lengths of the transmission line $Z_{11}$, the transmission line $Z_{21}$, the transmission line $Z_{12}$, and the transmission line $Z_{22}$ are respectively the same as or different from those of the inverse line $Z_{31}$, the inverse line $Z_{41}$, the inverse line $Z_{32}$, and the inverse line $Z_{42}$. For example, when electrical lengths of the transmission line $Z_{11}$, the transmission line $Z_{21}$, the transmission line $Z_{12}$, and the transmission line $Z_{22}$ are the same as those of the inverse line $Z_{31}$, the inverse line $Z_{41}$, the inverse line $Z_{32}$, and the inverse line $Z_{42}$, the first frequency multiplied signal I and the second frequency multiplied signal Q output by the frequency multiplier are orthogonal. A phase difference between second differential signals may be changed by adjusting electrical lengths of the inverse line $Z_{31}$, the inverse line $Z_{41}$, the inverse line $Z_{32}$, and the inverse line $Z_{42}$; that is, the frequency multiplier is enabled to output the first frequency multiplied signal I and the second frequency multiplied signal Q having a specific phase difference.

The parallel-connected electrical resistor/inductor is parallel-connected between the second end of the transmission line $Z_{11}$ and the second end of $Z_{12}$ and between two input ports $Z_{o1}$ and $Z_{o2}$ for eliminating a frequency deviation of the frequency multiplier.

The frequency multiplier according to an embodiment of the present disclosure may also include a parallel strip base cover, for example, a parallel transmission line base cover B, where the two stepped-impedance transmission lines, the two groups of open stubs, and the two inverse stepped-impedance transmission lines are placed on the parallel strip base cover. For example, a size L of the frequency multiplier may simply be obtained by using the following formula (I):

$$L = \frac{c}{4f\sqrt{\varepsilon_{eff}}} \quad (1)$$

where $\varepsilon_{eff}$ is an effective dielectric constant of the base, c is the speed of a light wave in free space, and f is a reference working frequency of the frequency multiplier. According to an embodiment of the present disclosure, the base cover may be adjusted (for example, adjusting the width of or space between every transmission line on the base cover of the base cover B) to control the effective dielectric constant of the base medium, thereby adjusting the size of the frequency multiplier of the present disclosure.

Figure 4:
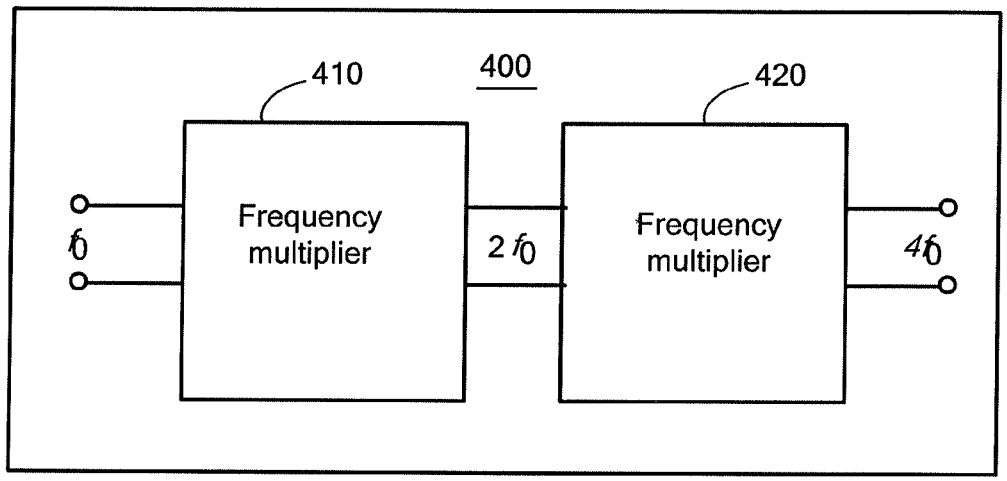
FIG. 4 is a block diagram of cascaded frequency multipliers according to an embodiment of the present disclosure.

FIG. 4 is a block diagram of a cascaded frequency multiplier 400 according to an embodiment of the present disclosure. The frequency multiplier 400 includes at least two cascaded frequency multipliers shown in FIG. 1 or FIG. 2, where a differential signal output by a frequency multiplier is input to another frequency multiplier. FIG. 4 shows two cascaded frequency multipliers shown in FIG. 1 or FIG. 2. Embodiments of the present disclosure are not limited thereto and multiple frequency multipliers may be cascaded.

An embodiment of the present disclosure may be applied to n-time frequency multiplying technologies. That is, frequency multipliers according to embodiments of the present disclosure are cascaded to output frequency multiplied signals of higher frequencies. Frequency multipliers according to an embodiment of the present disclosure are capable of outputting differential signals; therefore, after the frequency multipliers are cascaded, differential signals output by a frequency multiplier is input to a next frequency multiplier. For example, in FIG. 4, a first frequency multiplier 410 receives a differential signal having a frequency of $f_0$ and outputs a differential signal having a frequency of $2f_0$; a second frequency multiplier 420 receives the differential signal having the frequency of $2f_0$ from the first frequency multiplier 410, and outputs a differential signal having a frequency of $4f_0$, and so on.

Figure 5:
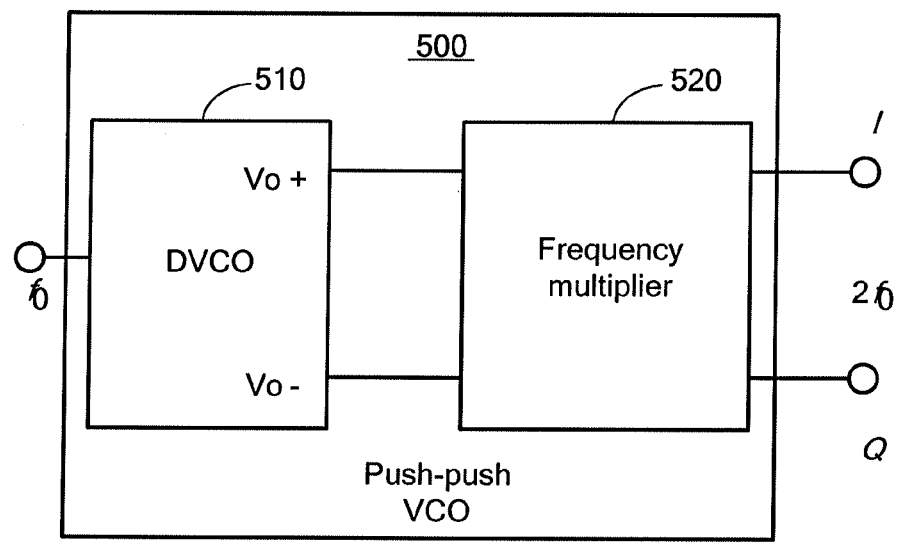
FIG. 5 is a block diagram of a voltage-controlled oscillator according to an embodiment of the present disclosure.

FIG. 5 is a block diagram of a voltage-controlled oscillator 500 according to an embodiment of the present disclosure.

According to an embodiment of the present disclosure, a voltage-controlled oscillator 500 based on a frequency multiplier according to an embodiment of the present disclosure is provided. For example, a push-push (Push-Push) voltage-controlled oscillator (Voltage Controlled Oscillator, VCO) includes a differential voltage-controlled oscillator (Differential Voltage Controlled Oscillator, DVCO) DVCO 510 and a frequency multiplier 520. The frequency multiplier 520 may be the frequency multiplier 100 in FIG. 1, the frequency multiplier 200 in FIG. 2, or the cascaded frequency multiplier 400 in FIG. 4. An output end of the DVCO 510 is connected to an input end of the frequency multiplier 520 and provides input differential signals for the frequency multiplier 520. Output of the frequency multiplier 520 is used as output of the push-push VCO 500. The DVCO 510 receives a signal having a frequency $f_0$, generates a differential signal having a frequency of $f_0$, and outputs the differential signal to the frequency multiplier 520. The frequency multiplier 520 receives the differential signal and generates a differential signal having a frequency of $2f_0$ (for example, orthogonal signals I and Q).

Figure 6A:
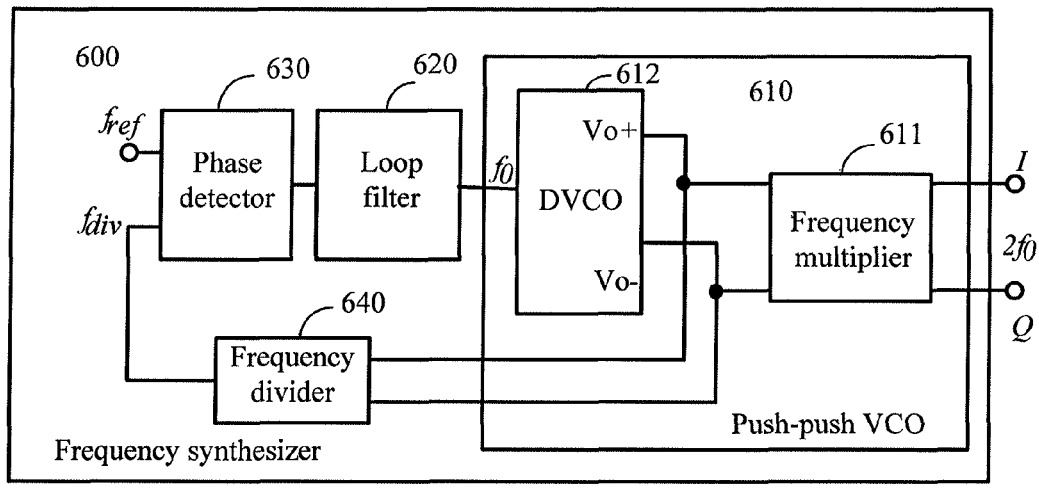
FIG. 6A is a block diagram of a frequency synthesizer according to an embodiment of the present disclosure.

FIG. 6A is a block diagram of a frequency synthesizer 600 according to an embodiment of the present disclosure.

According to an embodiment of the present disclosure, a frequency synthesizer 600 based on a frequency multiplier according to an embodiment of the present disclosure is provided. For example, the frequency synthesizer 600 may be a frequency synthesizer based on a phase-locked loop, including a push-push VCO 610, a loop filter 620, a phase detector 630, and a frequency divider 640. The push-push VCO 610 may be the voltage-controlled oscillator 500 in FIG. 5, including a DVCO 612 and a frequency multiplier 611. An input end of the frequency divider 640 is connected to an output end of the DVCO 612, an output end of the frequency divider 640 is connected to an input end $f_{div}$ of the phase detector 630, another input end of the phase detector 630 is $f_{ref}$, an output end of the phase detector 630 is connected to an input end of the loop filter 620, and an output end of the loop filter 620 is connected to an input end of the DVCO 612 to provide signals of a frequency $f_0$ to the push-push VCO 610; the frequency multiplier 611 receives a differential signal having a frequency $f_0$ from the output end of the DVCO 612 and outputs differential signals I and Q having a frequency of $2f_0$.

Figure 6B:
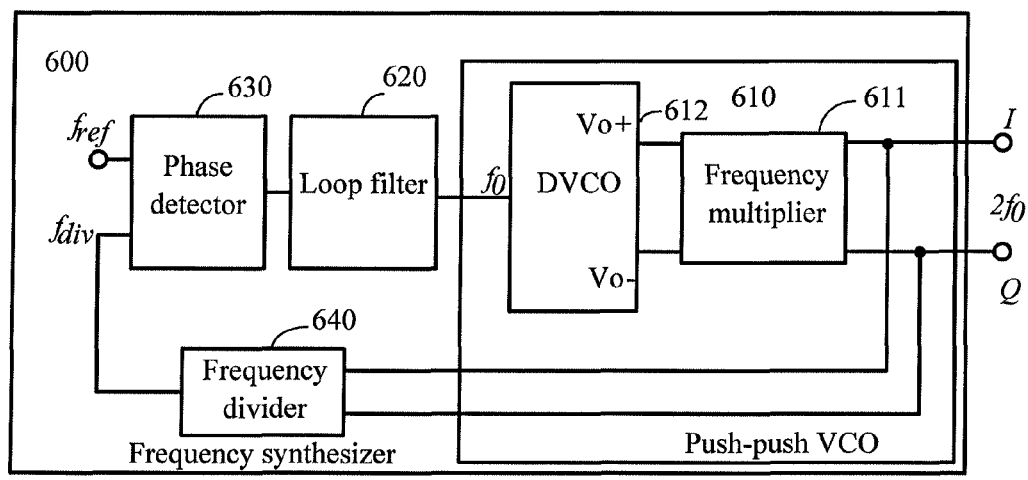
FIG. 6B is a block diagram of a frequency synthesizer according to an embodiment of the present disclosure.

FIG. 6B is a block diagram of a frequency synthesizer 600 according to an embodiment of the present disclosure.

According to an embodiment of the present disclosure, a frequency synthesizer 600 based on a frequency multiplier according to an embodiment of the present disclosure is provided. For example, the frequency synthesizer 600 may be a frequency synthesizer based on a phase-locked loop, including a push-push VCO 610, a loop filter 620, a phase detector 630, and a frequency divider 640. The push-push VCO 610 may be the voltage-controlled oscillator 500 in FIG. 5, including a DVCO 612 and a frequency multiplier 611. An input end of the frequency divider 640 is connected to an output end of the frequency multiplier 611, an output end of the frequency divider 640 is connected to an input end $f_{div}$ of the phase detector 630, another input end of the phase detector 630 is $f_{ref}$, an output end of the phase detector 630 is connected to an input end of the loop filter 620, and an output end of the loop filter 620 is connected to an input end of the DVCO 612 to provide signals of a frequency $f_0$ to the push-push VCO 610; the frequency multiplier 611 receives a differential signal having a frequency $f_0$ from the output end of the DVCO 612 and outputs differential signals I and Q having a frequency of $2f_0$.

Figure 7A:
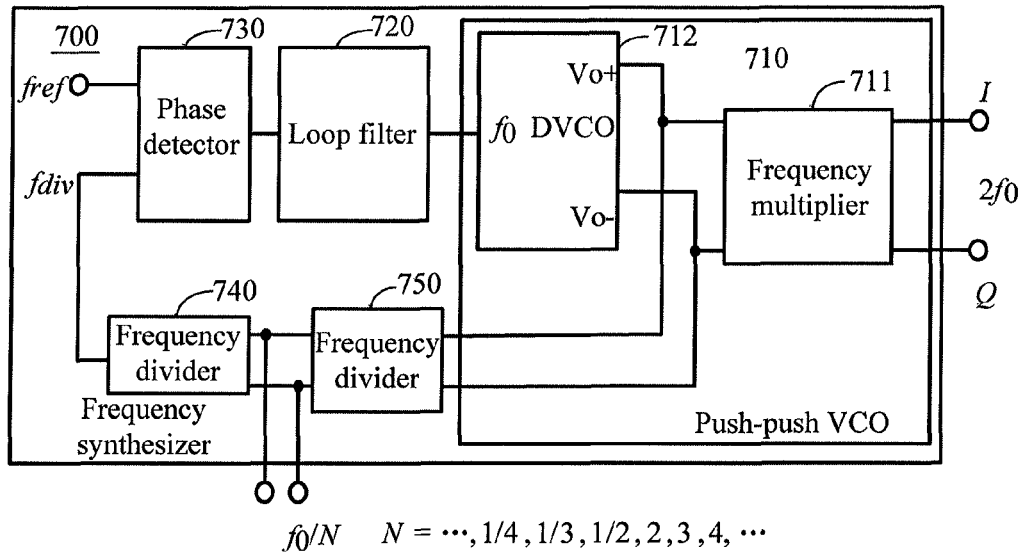
FIG. 7A is a block diagram of a frequency synthesizer according to another embodiment of the present disclosure.

FIG. 7A is a block diagram of a frequency synthesizer 700 according to another embodiment of the present disclosure.

According to an embodiment of the present disclosure, a frequency synthesizer 700 based on a frequency multiplier according to an embodiment of the present disclosure is provided. For example, the frequency synthesizer 700 may be a frequency synthesizer based on a phase-locked loop, including a push-push VCO 710, a loop filter 720, a phase detector 730, a frequency divider 740, and a frequency divider 750. The push-push VCO 710 may be the voltage-controlled oscillator 500 in FIG. 5, including a DVCO 712 and a frequency multiplier 711. An input end of the frequency divider 750 is connected to an output end of the DVCO 712 for outputting signals having a frequency $f_0/N$, where N= . . . , ¼, ⅓, ½, 2, 3, 4, . . . . An output end of the frequency divider 750 is also connected to an input end of the frequency divider 740, an output end of the frequency divider 740 is connected to an input end $f_{div}$ of the phase detector 730, another input end of the phase detector 730 is $f_{ref}$, an output end of the phase detector 730 is connected to an input end of the loop filter 720, and an output end of the loop filter 720 is connected to an input end of the DVCO 712 to provide signals having a frequency $f_0$ to the push-push VCO 710; the frequency multiplier 711 receives a differential signal having a frequency $f_0$ from the output end of the DVCO 712 and outputs differential signals I and Q having a frequency of $2f_0$.

Figure 7B:
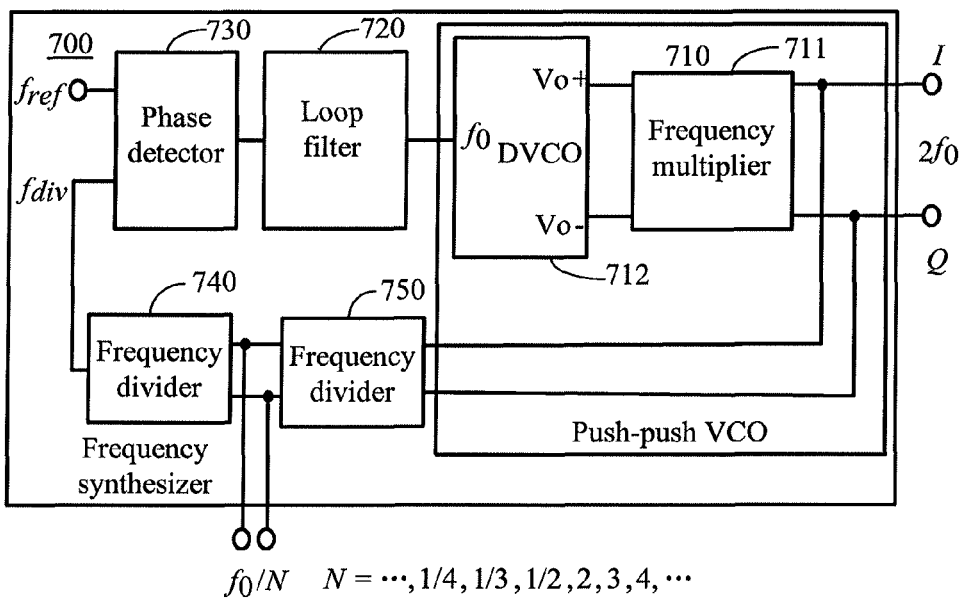
FIG. 7B is a block diagram of a frequency synthesizer according to another embodiment of the present disclosure.

FIG. 7B is a block diagram of a frequency synthesizer 700 according to another embodiment of the present disclosure.

According to an embodiment of the present disclosure, a frequency synthesizer 700 based on a frequency multiplier according to an embodiment of the present disclosure is provided. For example, the frequency synthesizer 700 may be a frequency synthesizer based on a phase-locked loop, including a push-push VCO 710, a loop filter 720, a phase detector 730, a frequency divider 740, and a frequency divider 750. The push-push VCO 710 may be the voltage-controlled oscillator 500 in FIG. 5, including a DVCO 712 and a frequency multiplier 711. An input end of the frequency divider 750 is connected to an output end of the frequency multiplier 711 for outputting signals having a frequency $f_0/N$, where N= . . . , ¼, ⅓, ½, 2, 3, 4, . . . . An output end of the frequency divider 750 is also connected to an input end of the frequency divider 740, an output end of the frequency divider 740 is connected to an input end $f_{div}$ of the phase detector 730, another input end of the phase detector 730 is $f_{ref}$, an output end of the phase detector 730 is connected to an input end of the loop filter 720, and an output end of the loop filter 720 is connected to an input end of the DVCO 712 to provide signals having a frequency $f_0$ to the push-push VCO 710; the frequency multiplier 711 receives a differential signal having a frequency $f_0$ from the output end of the DVCO 712 and outputs differential signals I and Q having a frequency of $2f_0$.

According to an embodiment of the present disclosure, a system based on a frequency multiplier is provided, including a chip and the above frequency synthesizer or the above frequency multiplier. The frequency multiplier or the frequency synthesizer may be integrated on the chip.

An embodiment of the present disclosure may further include a package, where the frequency multiplier or the frequency synthesizer is connected between the chip and the package, or the frequency multiplier or the frequency synthesizer is integrated on the package.

An embodiment of the present disclosure may further include a printed circuit board, where the frequency multiplier or the frequency synthesizer may be connected between the chip and the printed circuit board, or the frequency multiplier or the frequency synthesizer may be integrated on the printed circuit board.

FIG. 8A to FIG. 8G are schematic diagrams of an operating principle of a frequency multiplier according to an embodiment of the present disclosure.

Figure 8A:
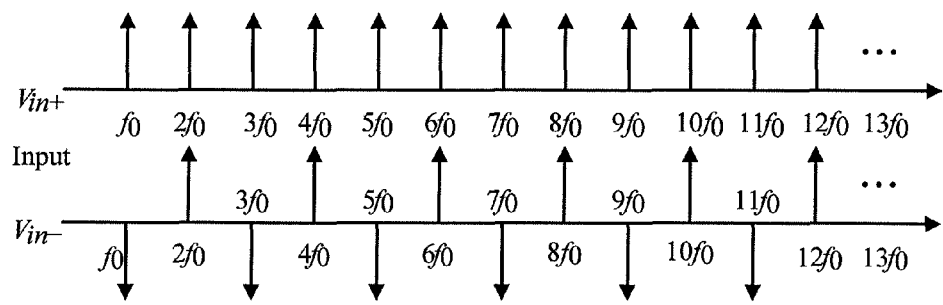
FIG. 8A to FIG. 8G are schematic diagrams of an operating principle of a frequency multiplier according to an embodiment of the present disclosure.
Figure 8B:
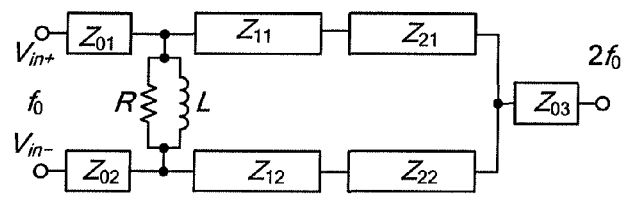
Figure 8C:
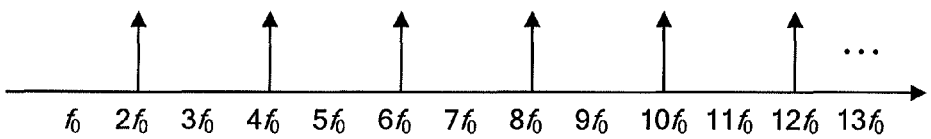
Figure 8D:
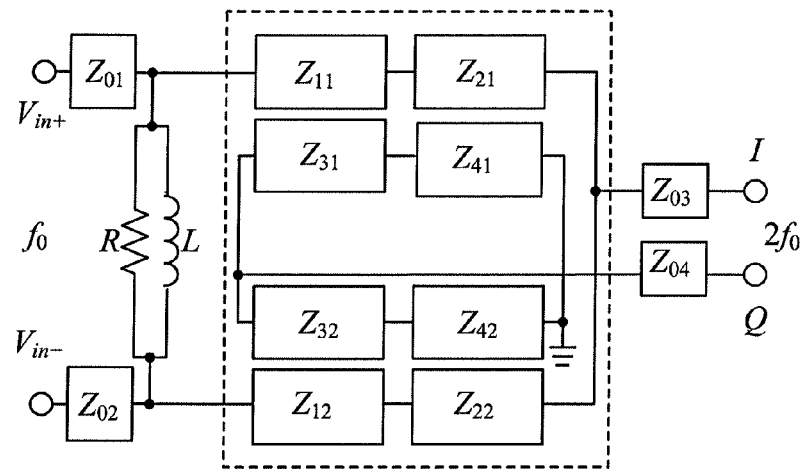
Figure 8E:
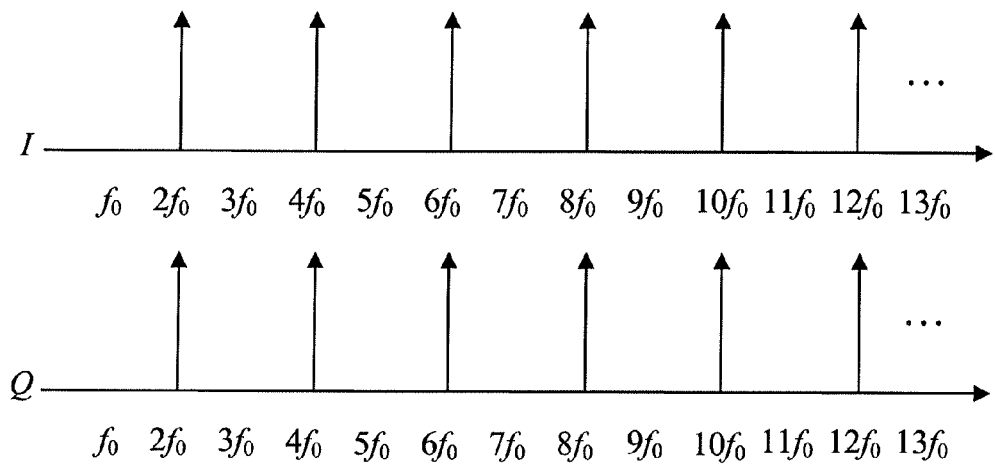
Figure 8F:
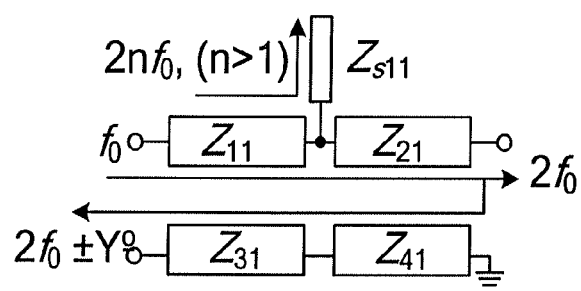
Figure 8G:
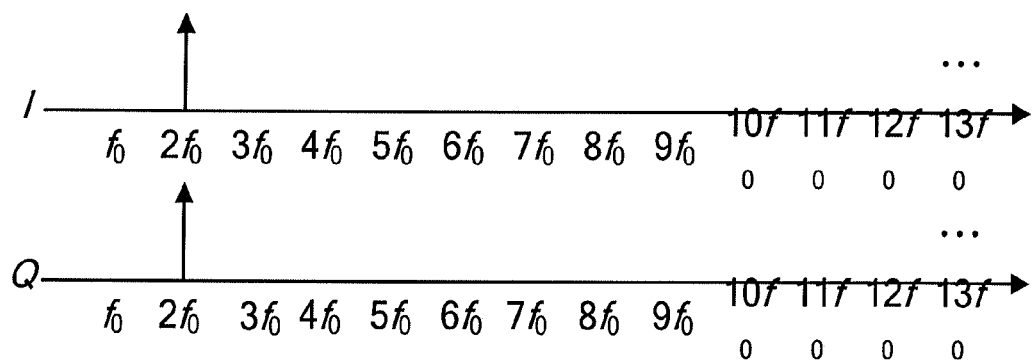

Referring to FIG. 8A, FIG. 8A shows frequency characteristics of a differential signal having a frequency $f_0$ input to input ends $V_{in+}$ and $V_{in-}$ of a frequency multiplier. Referring to FIG. 8B, FIG. 8B shows a circuit diagram of a frequency multiplier not including an inverse stepped-impedance transmission line and open stubs. Referring to FIG. 8C, FIG. 8C shows frequency characteristics of a signal having a working frequency $2f_0$ output by the frequency multiplier shown in FIG. 8B, where the signal includes even harmonic waves having frequencies $4f_0$, $6f_0$, $8f_0$, . . . . Frequency multiplied signals having a working frequency $2f_0$ are obtained and output by performing frequency synthesis on the input differential signal having a reference working frequency $f_0$ by using two $\lambda/4$ microstrip stepped-impedance transmission lines (each transmission line includes two transmission lines having an electrical length of $\lambda/8$) shown in FIG. 8B. Because the input frequency is a differential signal, the reference working frequency $f_0$ and odd harmonic waves (that is, $(2n-1)*f_0$, n=1, 2, 3, . . . ) are eliminated. In cases where no inverse stepped-impedance transmission line is included, the frequency multiplier has only one output. In cases where no open stub is included, the frequency multiplied signal may include even harmonic wave signals having frequencies $4f_0$, $6f_0$, $8f_0$, and so on. Referring to FIG. 8D, FIG. 8D is a circuit diagram of a frequency multiplier including inverse stepped-impedance transmission lines. In FIG. 8D, there are two paths of output, I and Q. Two inverse stepped-impedance transmission lines are capable of generating an energy beam with a phase deviation, thereby obtaining output signals I and Q. The two inverse stepped-impedance transmission lines are respectively coupled to the structure of two transmission lines, and sizes (for example, electrical lengths) of the inverse stepped-impedance transmission lines may be adjusted to obtain required differential signal output. Referring to FIG. 8E, FIG. 8E shows frequency characteristics of output signals of the transmission lines and the inverse stepped-impedance transmission lines. Referring to FIG. 8F, FIG. 8F is a schematic diagram showing a principle that the open stubs eliminate harmonic components and that the inverse stepped-impedance transmission lines generate a second frequency multiplied signal. For simplicity, FIG. 8F shows only one transmission line of the two transmission lines, one inverse stepped-impedance transmission line (for generating a differential signal having a frequency $2f_0$ and a phase difference Y'), and one open stub (for eliminating a harmonic component having, for example, a frequency $4f_0$). Due to strong resonance characteristics of the open stubs at a specific frequency, energy corresponding to the resonance frequencies cannot pass through the stepped-impedance transmission line structure $Z_{11}$ to reach $Z_{21}$, thereby suppressing harmonic waves. As a result, open stubs may be adjusted to correspondingly suppress even harmonic components of $4f_0$, $6f_0$, $8f_0$, and the like, and high order harmonic suppression with low power backoff is implemented by using characteristics of the open stubs of absorbing energy at corresponding frequencies.

FIG. 9A to FIG. 9E are schematic installation diagrams according to an embodiment of the present disclosure.

Figure 9A:
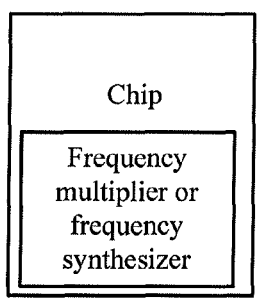
FIG. 9A to FIG. 9E are schematic installation diagrams according to an embodiment of the present disclosure.
Figure 9B:
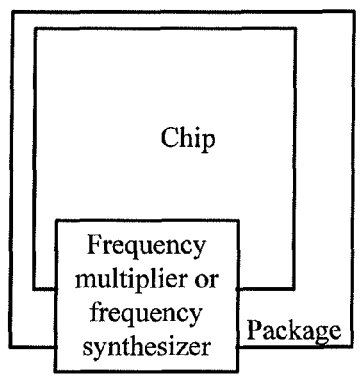
Figure 9C:
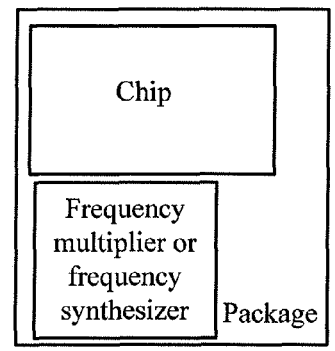
Figure 9D:
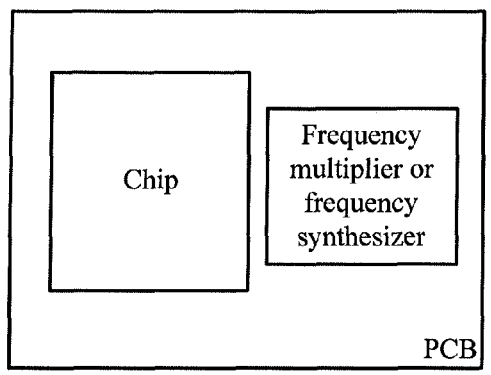
Figure 9E:
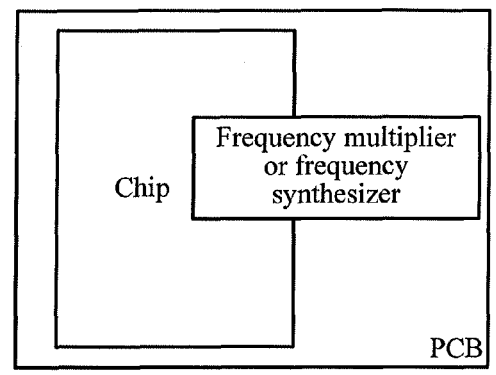

Referring to FIG. 9A, a frequency multiplier or a frequency synthesizer according to an embodiment of the present disclosure may be integrated in a chip. Referring to FIGS. 9B and 9C, a frequency synthesizer or a frequency multiplier according to an embodiment of the present disclosure may be connected between a package and a chip or be integrated on a package. Referring to FIGS. 9D and 9E, a frequency synthesizer or a frequency multiplier according to an embodiment of the present disclosure may be system-integrated. For example, the frequency synthesizer or the frequency multiplier may be connected between a printed circuit board and a chip or be integrated on a printed circuit board (Printed Circuit Board, PCB). According to an embodiment of the present disclosure, an implementation mode with low cost may be used according to requirements.

Figure 10:
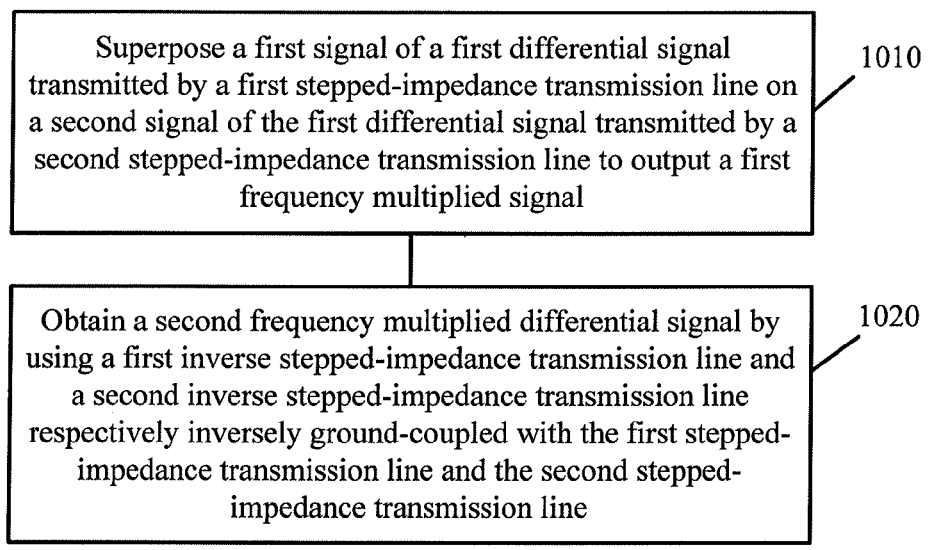
FIG. 10 is a schematic flowchart of a method for generating frequency multiplied signals according to an embodiment of the present disclosure.

FIG. 10 is a schematic flowchart of a method for generating frequency multiplied signals according to an embodiment of the present disclosure.

1010. Superpose a first signal of a first differential signal transmitted by a first stepped-impedance transmission line on a second signal of the first differential signal transmitted by a second stepped-impedance transmission line to output a first frequency multiplied signal, where a frequency of the first frequency multiplied signal is 2*N times a frequency of the first differential signal, and N is an integer greater than or equal to 1.

1020. Obtain a second frequency multiplied signal by using a first inverse stepped-impedance transmission line and a second inverse stepped-impedance transmission line respectively inversely ground-coupled with the first stepped-impedance transmission line and the second stepped-impedance transmission line, where the first frequency multiplied signal and the second frequency multiplied signal are second differential signals, a frequency of the second frequency multiplied signal is 2*N times the frequency of the first differential signal, and a phase difference between the second frequency multiplied signals is equal to 90 degrees or not equal to 90 degrees.

Optionally, in another embodiment, the method in FIG. 10 further includes: suppressing harmonic components of the first differential signal by using a first group of open stubs connected to the first stepped-impedance transmission line and a second group of open stubs connected to the second stepped-impedance transmission line.

According to the solution, input differential signals may be superposed by using two inverse stepped-impedance transmission lines respectively inversely ground-coupled with two stepped-impedance transmission lines, so that frequency multiplied differential signals are output. In addition, harmonic components in a differential signal input to two transmission lines of the frequency multiplier are suppressed by using two groups of open stubs, so that a pure frequency multiplied signal is obtained. Because no filter is required, power backoff can be reduced. Therefore, no additional power is required to amplify a frequency multiplied signal, and system design may be simplified.

Persons of ordinary skill in the art may appreciate that, in combination with the examples described in the embodiments herein, units and algorithm steps can be implemented by electronic hardware, computer software, or a combination thereof. In order to clearly describe the interchangeability between the hardware and the software, the foregoing has generally described compositions and steps of every embodiment according to functions. Whether the functions are executed by hardware or software depends on particular applications and design constraint conditions of the solutions. Persons skilled in the art can use different methods to implement the described functions for every particular application, but it should not be considered that the implementation goes beyond the scope of the present disclosure.

It can be clearly understood by persons skilled in the art that, for the purpose of convenient and brief description, for a detailed working process of the foregoing system, apparatus and unit, reference may be made to the corresponding process in the method embodiments, and the details will not be described herein again.

In the embodiments provided in the present application, it should be understood that the disclosed system, apparatus, and method may be implemented in other modes. For example, the described device embodiments are merely exemplary. For example, the unit division is merely logical function division and can be other division in actual implementation. For example, multiple units or components can be combined or integrated into another system, or some features can be ignored or not performed. In addition, the displayed or discussed mutual couplings or direct couplings or communication connections are implemented through some interfaces. The indirect couplings or communication connections between the devices or units may be implemented in electronic, mechanical or other forms.

The units described as separate parts may or may not be physically separate, and parts displayed as units may or may not be physical units, may be located in one position, or may be distributed on multiple network elements. A part or all of the units may be selected according to the actual needs to achieve the objectives of the solutions of the embodiments.

In addition, functional units in the embodiments of the present disclosure may be integrated into a processing unit, or each of the units may exist alone physically, or two or more units are integrated into a unit. The integrated unit may be implemented in a form of hardware, or may be implemented in a form of a software functional unit.

When being implemented in the form of a software functional unit and sold or used as a separate product, the integrated unit may be stored in a computer-readable storage medium. Based on such understanding, the solutions of the present disclosure essentially, or the part contributing to the prior art, or all or a part of the solutions may be implemented in a form of a software product. The computer software product is stored in a storage medium and includes several instructions for instructing a computer device (which may be a personal computer, a server, or a network device, etc.) to execute all or a part of steps of the methods described in the embodiments of the present disclosure. The storage medium includes: any medium that can store program code, such as a U-disk, a removable hard disk, a read-only memory (ROM, Read-Only Memory), a random access memory (RAM, Random Access Memory), a magnetic disk, or an optical disk.

The foregoing descriptions are merely exemplary embodiments of the present disclosure, but the protection scope of the present disclosure is not limited thereto. Any variation or replacement that can be easily made by persons skilled in the art without departing from the disclosed scope of the present disclosure shall fall within the protection scope of the present disclosure. Therefore, the protection scope of the present disclosure shall be subject to the appended claims.

What is claimed is:

1. A frequency multiplier, comprising:
    a first stepped-impedance transmission line configured to receive a first signal of a first differential signal at a first input end;
    a second stepped-impedance transmission line configured to receive a second signal of the first differential signal at a second input end, wherein the first stepped-impedance transmission line and the second stepped-impedance transmission line superpose the first signal of the first differential signal on the second signal of the first differential signal to obtain a first frequency multiplied signal at an output end, a frequency of the first frequency multiplied signal is 2*N times a frequency of the first differential signal, and N is an integer greater than or equal to 1;
    a first inverse stepped-impedance transmission line configured to be inversely ground-coupled with the first stepped-impedance transmission line and grounded at an end near an output end of the first stepped-impedance transmission line; and
    a second inverse stepped-impedance transmission line configured to be inversely ground-coupled with the second stepped-impedance transmission line and grounded at an end near an output end of the second stepped-impedance transmission line, wherein the first stepped-impedance transmission line and the first inverse stepped-impedance transmission line are in parallel, and wherein the second stepped-impedance transmission line and the second inverse stepped-impedance transmission line are in parallel, so that when a signal is transmitted in the first stepped-impedance transmission line and the second stepped-impedance transmission line, a corresponding resonance signal is generated in the first inverse stepped-impedance transmission line and the second inverse stepped-impedance transmission line; and
    wherein another end of the first inverse stepped-impedance transmission line and another end of the second inverse stepped-impedance transmission line superpose signals to output a second frequency multiplied signal, a frequency of the second frequency multiplied signal is 2*N times the frequency of the first differential signal, and the first frequency multiplied signal and the second frequency multiplied signal are second differential signals.

2. The frequency multiplier according to claim 1, further comprising:
    a first group of open stubs, wherein an end of the first group of open stubs is connected to the first stepped-impedance transmission line and another end is open for suppressing harmonic components of the first differential signal; and
    a second group of open stubs, wherein an end of the second group of open stubs is connected to the second stepped-impedance transmission line and another end is open for suppressing harmonic components of the first differential signal.

3. The frequency multiplier according to claim 2, wherein the first stepped-impedance transmission line comprises a first transmission line and a second transmission line having different characteristic impedance, wherein a first end of the first transmission line is connected to a first end of the second transmission line; the second stepped-impedance transmission line comprises a third transmission line and a fourth transmission line having different characteristic impedance, wherein a first end of the third transmission line is connected to a first end of the fourth transmission line, a second end of the first transmission line is connected to the first input end of the frequency multiplier, a second end of the third transmission line is connected to the second input end of the frequency multiplier, a second end of the second transmission line is connected to a second end of the fourth transmission line and to a first output end of the frequency multiplier.

4. The frequency multiplier according to claim 3, wherein characteristic impedance and an electrical length of the first transmission line are respectively the same as characteristic impedance and an electrical length of the third transmission line, and characteristic impedance and an electrical length of the second transmission line are respectively the same as characteristic impedance and an electrical length of the fourth transmission line.

5. The frequency multiplier according to claim 3, wherein an end of every open stub in the first group of open stubs is connected to the first end of the first transmission line, and an end of every open stub in the second group of open stubs is connected to the first end of the third transmission line.

6. The frequency multiplier according to claim 3, wherein an end of the first group of open stubs is connected to the second end of the first transmission line, and an end of the second group of open stubs is connected to the second end of the third transmission line.

7. The frequency multiplier according to claim 3, wherein the first transmission line, the second transmission line, the third transmission line, and the fourth transmission line are $\lambda/8$ transmission lines, either one of the first group of open stubs and the second group of open stubs comprises open stubs having an electrical length of $\lambda/(4n)$, wherein $\lambda$ is a wavelength corresponding to the frequency of the first differential signal, and n is an even number greater than or equal to 4.

8. The frequency multiplier according to claim 3, wherein the first inverse stepped-impedance transmission line comprises a first inverse line and a second inverse line having different characteristic impedance, the first inverse line is inversely coupled with the first transmission line, the second inverse line is inversely coupled with the second transmission line, and a first end of the first inverse line is connected to a first end of the second inverse line; and
    the second inverse stepped-impedance transmission line comprises a third inverse line and a fourth inverse line having different characteristic impedance, the third inverse line is inversely coupled with the third transmission line, the fourth inverse line is inversely coupled with the fourth transmission line, and a first end of the third inverse line is connected to a first end of the fourth inverse line,
    wherein a second end of the first inverse line and a second end of the third inverse line are parallel-connected and output to a second output end of the frequency multiplier, and a second end of the second inverse line and a second end of the fourth inverse line are parallel-connected and grounded.

9. The frequency multiplier according to claim 3, wherein electrical lengths of the first inverse stepped-impedance transmission line and the second inverse stepped-impedance transmission line are respectively the same as from those of the first stepped-impedance transmission line and the second stepped-impedance transmission line, so that a phase difference between the first frequency multiplied signal and the second frequency multiplied signal is equal to 90 degrees.

10. The frequency multiplier according to claim 3, wherein electrical lengths of the first inverse stepped-impedance transmission line and the second inverse stepped-impedance transmission line are respectively different from those of the first stepped-impedance transmission line and the second stepped-impedance transmission line, so that a phase difference between the first frequency multiplied signal and the second frequency multiplied signal is not equal to 90 degrees.

11. The frequency multiplier according to claim 9, wherein electrical lengths of the first transmission line, the second transmission line, the third transmission line, and the fourth transmission line are respectively the same as those of the first inverse line, the second inverse line, the third inverse line, and the fourth inverse line.

12. The frequency multiplier according to claim 9, wherein electrical lengths of the first transmission line, the second transmission line, the third transmission line, and the fourth transmission line are respectively different from those of the first inverse line, the second inverse line, the third inverse line, and the fourth inverse line.

13. The frequency multiplier according to claim 2, further comprising a parallel strip base cover, wherein the first stepped-impedance transmission line, the second stepped-impedance transmission line, the first group of open stubs, the second group of open stubs, the first inverse stepped-impedance transmission line, and the second inverse stepped-impedance transmission line are placed on the parallel strip base cover.

14. The frequency multiplier according to claim 1, wherein the frequency multiplier is cascaded with a second frequency multiplier, and the second differential signal of the frequency multiplier is a differential signal to be input to the second frequency multiplier.

* * * * *